(12) United States Patent
Setsompop et al.

(10) Patent No.: US 10,901,061 B2
(45) Date of Patent: Jan. 26, 2021

(54) ACCELERATED DIFFUSION-WEIGHTED MAGNETIC RESONANCE IMAGING WITH SELF-NAVIGATED, PHASE CORRECTED TILTED KERNEL RECONSTRUCTION OF PHASE ENCODED AND POINT SPREAD FUNCTION ENCODED K-SPACE

(71) Applicant: The General Hospital Corporation, Boston, MA (US)

(72) Inventors: Kawin Setsompop, Charlestown, MA (US); Lawrence L. Wald, Cambridge, MA (US); Zijing Dong, Beijing (CN); Hua Guo, Beijing (CN); Fuyixue Wang, Cambridge, MA (US); Timothy G. Reese, Medford, MA (US)

(73) Assignee: The General Hospital Corporation, Boston, MA (US)

( * ) Notice: Subject to any disclaimer, the term of this patent is extended or adjusted under 35 U.S.C. 154(b) by 0 days.

(21) Appl. No.: 16/429,469

(22) Filed: Jun. 3, 2019

(65) Prior Publication Data

US 2019/0369199 A1 Dec. 5, 2019

Related U.S. Application Data

(60) Provisional application No. 62/679,339, filed on Jun. 1, 2018.

(51) Int. Cl.
| | | |
|---|---|---|
| *G01R 33/565* | (2006.01) |
| *G01R 33/561* | (2006.01) |
| *G01R 33/563* | (2006.01) |
| *G01R 33/58* | (2006.01) |

(52) U.S. Cl.
CPC ... *G01R 33/56545* (2013.01); *G01R 33/5612* (2013.01); *G01R 33/5616* (2013.01); *G01R 33/56341* (2013.01); *G01R 33/58* (2013.01)

(58) Field of Classification Search
CPC .......... G01R 33/56545; G01R 33/5616; G01R 33/5612; G01R 33/56341; G01R 33/58; G01R 33/4835; G01R 33/5676; G01R 33/5611; G06T 11/005
See application file for complete search history.

(56) References Cited

U.S. PATENT DOCUMENTS

2019/0162807 A1* 5/2019 Zahneisen .......... G01R 33/5616

* cited by examiner

*Primary Examiner* — Susan S Lee
(74) *Attorney, Agent, or Firm* — Quarles & Brady LLP

(57) ABSTRACT

Systems and methods for accelerated diffusion-weighted magnetic resonance imaging using a tilted reconstruction kernel to synthesize unsampled k-space data in phase encoded and point spread function ("PSF") encoded k-space data are provided. Images reconstructed from the data have reduced $B_0$-related distortions and reduced $T_2^*$ blurring. In general, data are acquired with systematically optimized undersampling of the PSF and phase encoding subspace. Parallel imaging reconstruction is implemented with a $B_0$ inhomogeneity informed approach to achieve greater than twenty-fold acceleration of the PSF encoding dimension. A tilted reconstruction kernel is used to exploit the correlations in the phase encoding-PSF encoding subspace. Self-navigated phase corrections are computed from the acquired data and used to synthesize the unsampled k-space data.

16 Claims, 7 Drawing Sheets

ACCELERATED DIFFUSION-WEIGHTED MAGNETIC RESONANCE IMAGING WITH SELF-NAVIGATED, PHASE CORRECTED TILTED KERNEL RECONSTRUCTION OF PHASE ENCODED AND POINT SPREAD FUNCTION ENCODED K-SPACE

CROSS-REFERENCE TO RELATED APPLICATIONS

This application claims the benefit of U.S. Provisional Patent Application Ser. No. 62/679,339 filed on Jun. 1, 2018, and entitled "ACCELERATED DIFFUSION-WEIGHTED MAGNETIC RESONANCE IMAGING WITH SELF-NAVIGATED, PHASE CORRECTED TILTED KERNEL RECONSTRUCTION OF PHASE ENCODED AND POINT SPREAD FUNCTION ENCODED K-SPACE," which is herein incorporated by reference in its entirety.

STATEMENT REGARDING FEDERALLY SPONSORED RESEARCH

This invention was made with government support under EB020613, EB019437, and EB015896, awarded by the National Institutes of Health. The government has certain rights in the invention.

BACKGROUND

Single-shot echo planar imaging ("SS-EPI") is widely used for diffusion imaging, but suffers from susceptibility-induced distortion and $T_2^*$ blurring, which limit its resolution and ability to detect detailed structures. To reduce distortion and blurring, SS-EPI with parallel imaging has been developed to reduce the effective echo spacing ("ESP"). However, the ability to mitigate distortion and blurring is limited by the achievable parallel imaging acceleration, with higher accelerations leading to more severe SNR loss. As an alternative, a number of multi-shot EPI approaches have been proposed to reduce the distortion while maintaining high SNR. Nevertheless, to achieve imaging with distortions reduced or otherwise removed, a very large number of shots is required, and navigator acquisitions might also be necessary for phase correction.

Recently, a distortion-free and blurring-free imaging technique termed point-spread-function encoded EPI ("PSF-EPI") has been applied to diffusion imaging with a two-dimensional phase navigator acquisition, allowing high-quality and high-resolution diffusion-weighted imaging ("DWI"). Nonetheless, the acquisition time of PSF-EPI is extremely long. For example, fully-sampled PSF-EPI needs about 200 shots for 1 mm-resolution brain imaging, and even with accelerated methods about 40 shots are still necessary.

SUMMARY OF THE DISCLOSURE

The present disclosure addresses the aforementioned drawbacks by providing a method for reconstructing an image of a subject from data acquired with a magnetic resonance imaging ("MRI") system. First data are acquired with an MRI system. The first data include k-space data encoded along at least a phase encoding dimension and a point spread function ("PSF") encoding dimension. The first data are also undersampled along at least one of the phase encoding dimension or the PSF encoding dimension. The first data also include non-diffusion-weighted data and diffusion-weighted data. Phase correction data are generated from the first data by estimating a phase correction value for each PSF encoding in the first data. Each phase correction value is computed by reconstructing a diffusion weighted image from the diffusion weighted data acquired at a particular PSF encoding, reconstructing a non-diffusion-weighted image from the non-diffusion-weighted image acquired at the particular PSF encoding, and computing a difference between a phase of the diffusion-weighted image and a phase of the non-diffusion-weighted image. Calibration data are provided to the computer system, and phase corrected calibration data are generated by combining the phase correction data with the calibration data. Second data are generated with a computer system by synthesizing unsampled k-space points in at least one of the phase encoding dimension or the PSF encoding dimension by using the phase corrected calibration data and applying a tilted reconstruction kernel to the first data. The tilted reconstruction kernel spans the phase encoding dimension and the PSF encoding dimension. An image is reconstructed from the second data, wherein the image has reduced distortions and $T_2^*$-blurring relative to images reconstructed from the first data.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Described here are systems and methods for generating distortion-free and $T_2^*$-blurring-free images with magnetic resonance imaging ("MRI"). In particular, a pulse sequence that provides for phase encoding and point spread function ("PSF") encoding of k-space data is used to acquire diffusion weighted data. As an example, a PSF-encoded EPI ("PSF-EPI") sequence with diffusion weighting gradients can be used. PSF-EPI utilizes an additional phase-encoding dimension, PSF-encoding ($k_{PSF}$), to acquire a distortion-free spatial dimension.

The systems and methods described in the present disclosure acquire data with a systematically optimized undersampling of the PSF and phase encoding subspace (e.g., $k_{PSF}$-$k_{PE}$ subspace). Parallel imaging reconstruction is implemented with a $B_0$-inhomogeneity informed approach to achieve greater than twenty-fold acceleration of the PSF encoding dimension. A tilted reconstruction kernel is used to exploit the correlations in the $k_{PSF}$-$k_{PE}$ subspace. Because the systems and methods described in the present disclosure implement a tilted kernel, they may be generally referred to as "tilted-CAIPI."

Further, the systems and methods described in the present disclosure implement self-navigated phase correction to address and overcome errors associated with the diffusion-induced phase.

Figure 1:
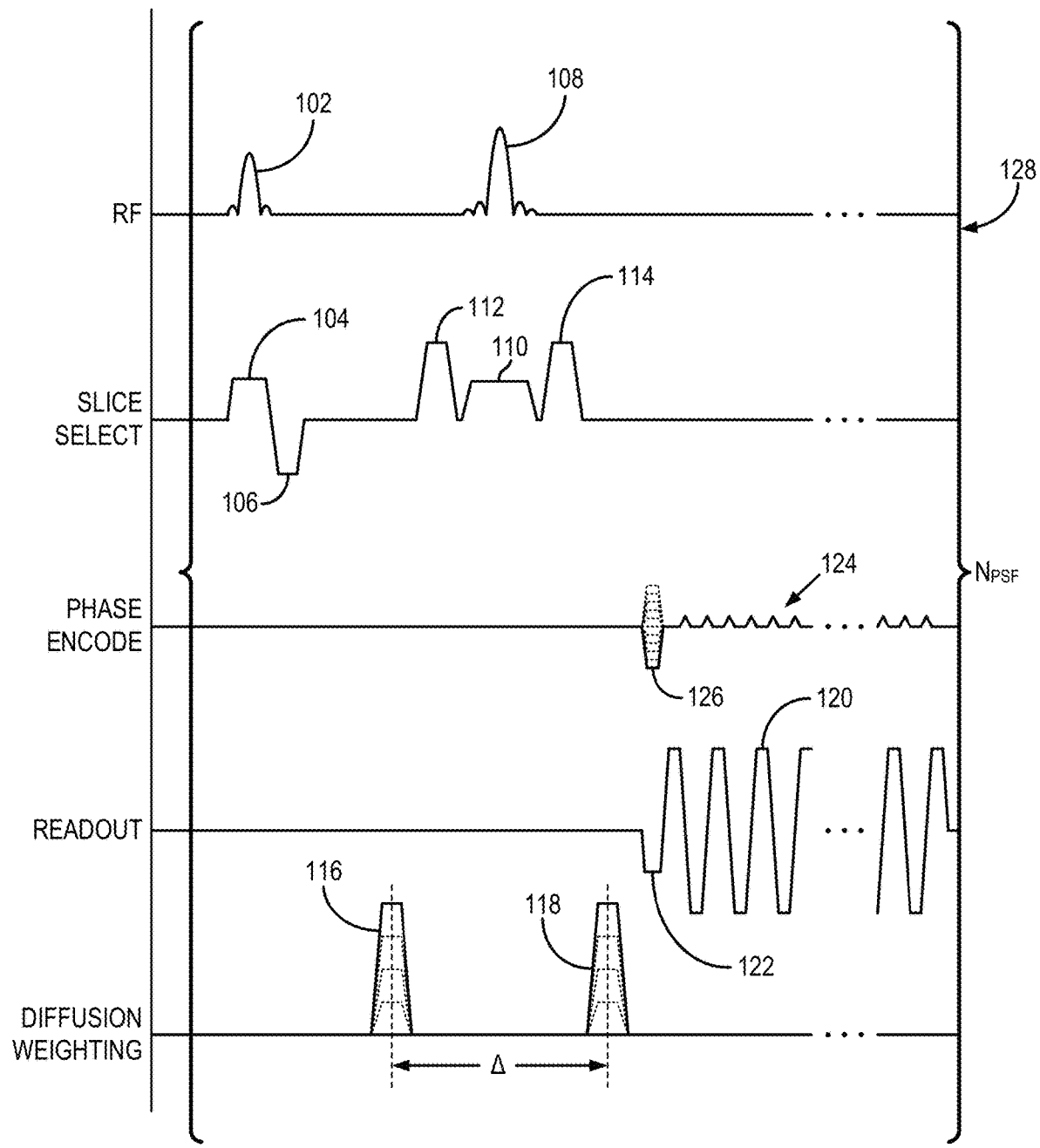
FIG. 1 is an example of a diffusion-weighted, point-spread-function encoding echo planar imaging ("PSF-EPI") pulse sequence that can be implemented with some embodiments described in the present disclosure.

Referring now to FIG. 1, an example of a PSF-EPI pulse sequence is shown. In this example, data are acquired by forming and sampling gradient echoes; however, data can also be acquired using a spin-echo EPI sequence. As shown, a spin-warp gradient along the phase-encoding direction is applied before the EPI readout, and changes shot-to-shot. Because signals along the PSF direction are acquired at the same echo time, there is no susceptibility-induced phase accumulation or $T_2^*$ decay; thus, the PSF-encoding dimension is distortion-free and blurring-free. To improve the acquisition efficiency, the PSF-encoding dimension can be undersampled by a very large acceleration factor, and can be well-reconstructed using a tilted-CAIPI reconstruction, which is described in detail below. For further acceleration and TE shortening, partial Fourier acquisition along both PSF and PE dimensions can be applied, and recovered by an algorithm such as the POCS algorithm.

The example pulse sequence shown in FIG. 1 includes a radio frequency ("RF") excitation pulse 102 that is played out in the presence of a slice-select gradient 104 in order to produce transverse magnetization in a prescribed imaging slice. The slice-select gradient 104 includes a rephasing lobe 106 that acts to rephase unwanted phase dispersions introduced by the slice-select gradient 104, such that signal losses resultant from these phase dispersions are mitigated. Next, a refocusing RF pulse 108 is applied in the presence of another slice select gradient 110 in order to refocus transverse spin magnetization. In order to reduce unwanted phase dispersions, a first crusher gradient 112 bridges the slice select gradient 110 with a second crusher gradient 114.

The slice select gradient 110 and crusher gradients 112 and 114 are further bridged by a first and second diffusion weighting gradient, 116 and 118, respectively. These diffusion weighting gradients 116 and 118 are equal in size, that is, their areas are equal. The diffusion weighting gradients 116 and 118, while shown on a separate "diffusion weighting" gradient axis, are in fact produced through the application of diffusion weighting gradient lobes along each of the slice-encoding, phase-encoding, and frequency-encoding gradient directions. By changing the amplitudes and other characteristics of the diffusion weighting gradient lobes, the acquired echo signals can be weighted for diffusion occurring along any arbitrary direction. For example, when the diffusion weighting gradients 116 and 118 are composed solely of gradient lobes applied along the $G_z$ gradient axis, the acquired echo signals will be weighted for diffusion occurring along the z-direction. As another example, if the diffusion weighting gradients 116 and 118 are composed of gradient lobes applied along both the $G_x$ and $G_y$ gradient axes, then the echo signals will be weighted for diffusion occurring in the x-y plane along a direction defined by the relative amplitudes of the gradient lobes.

Diffusion weighting of the acquired echo signals is provided when spins undergo random Brownian motion, or diffusion, during the time interval, $\Delta$, spanned between the application of the first and second diffusion gradients 116 and 118, respectively. The first diffusion weighted gradient 116 dephases the spins in the imaging volume, whereas the second diffusion weighted gradient 118 acts to rephase the spins by an equal amount. When spins undergo random diffusive motion during this time interval, however, their phases are not properly rephased by the second diffusion gradient 118. This phase difference results in a signal attenuation related to the diffusion occurring along the direction prescribed by the diffusion weighting gradients 116 and 118. The more diffusion that occurs, the more signal attenuation that results.

Following excitation of the nuclear spins in the prescribed imaging volume, data are acquired by sampling a series of diffusion-weighted echo signals in the presence of an alternating readout gradient 120. The alternating readout gradient 120 is preceded by the application of a pre-winding gradient 122 that acts to move the first sampling point along the frequency-encoding, or readout, direction by a prescribed distance in k-space. Spatial encoding of the echo signals along a phase-encoding direction is performed by a series of phase encoding gradient "blips" 124, which are each played out in between the successive signal readouts such that each echo signal is separately phase-encoded. The phase-encoding gradient blips 124 are preceded by the application of a pre-winding gradient 126 that acts to move the first sampling point along the phase-encoding direction by a prescribed distance in k-space. Here, the pre-winding gradient 126 is implemented using a gradient table, in which the pulse sequence is repeated $N_{PSF}$ different times for $N_{PSF}$ different values for the pre-winding gradient 126. The bracket 128 thus represents the PSF-encoding loop that sample a point, $k_{PSF}$, on the PSF-encoding axis at a plurality of different points, $k_{PE}$, on the phase-encoding axis. Because the phase-encoding gradient blips 124 and pre-winding gradients 126 are played out on the same gradient axis, both the PSF-encoding axis and the phase-encoding axis will lie on the same direction in k-space (e.g., $k_y$), but represent different encodings of data.

As is known in the art, the foregoing pulse sequence can be repeated a plurality of times while applying a different slice select gradients 104 and 110 during each repetition such that a plurality of slice locations are sampled. In some other implementations, a simultaneous multislice excitation and acquisition scheme can also be implemented. As one example, the blipped-CAIPIRINHA acquisition described in U.S. Pat. No. 8,405,395, which is herein incorporated by reference in its entirety, can be implemented.

Using a PSF-EPI pulse sequence, data are acquired as a 3D k-space data set ($k_x$, $k_y$, $k_{PSF}$) for each slice, where $k_y$ (e.g., $k_{PE}$) and $k_{PSF}$ both implement gradient-encoding along the y-direction. As noted above, each EPI-shot (e.g., each repetition of the bracket 128) uses the pre-winding gradient 126 blip to achieve a particular $k_{PSF}$ encoding step. At a certain $k_{PE}$ point, all the PSF-encoding signals are acquired at the same echo time; therefore, there is no distortion and $T_2^*$ blurring along the PSF direction.

In conventional accelerated PSF-EPI, the $k_{PE}$-$k_{PSF}$ encodings are undersampled by $R_{PE} \times R_{PSF}$ and recovered using sequential PE-GRAPPA and PSF-GRAPPA reconstructions. Here, $R_{PE}$ is used to reduce effective echo spacing ("ESP") and thereby the level of distortion, blurring, or both, which enables higher $R_{PSF}$ accelerations (i.e., less EPI-shots).

To achieve higher acceleration for PSF-EPI, the systems and methods described in the present exploit the inherent correlation of PE-PSF encoding through optimized subsampling and reconstruction. As described above, in PSF-EPI, $k_{PSF}$ encoding utilizes a pre-winding gradient 126 to shift the effective phase-encoding of each EPI-shot. As a result, data points along a diagonal line (e.g., a −45 degree line) in the $k_{PE}$-$k_{PSF}$ plane share the same effective y-gradient encoding, with additional encodings from $B_0$-inhomogeneity induced phase and $T_2/T_2^*$ signal decay. Because the time differences are very small among neighboring points along this diagonal line (e.g., a few milliseconds), a tilted compact kernel operator in $k_{PE}$-$k_{PSF}$ across multi-coil data can be used to effectively capture the small $B_0$-inhomogeneity induced phase, and to interpolate small $T_2^*$ decay, in order to recover undersampled data along $k_{PE}$-$k_{PSF}$.

Figure 2A:
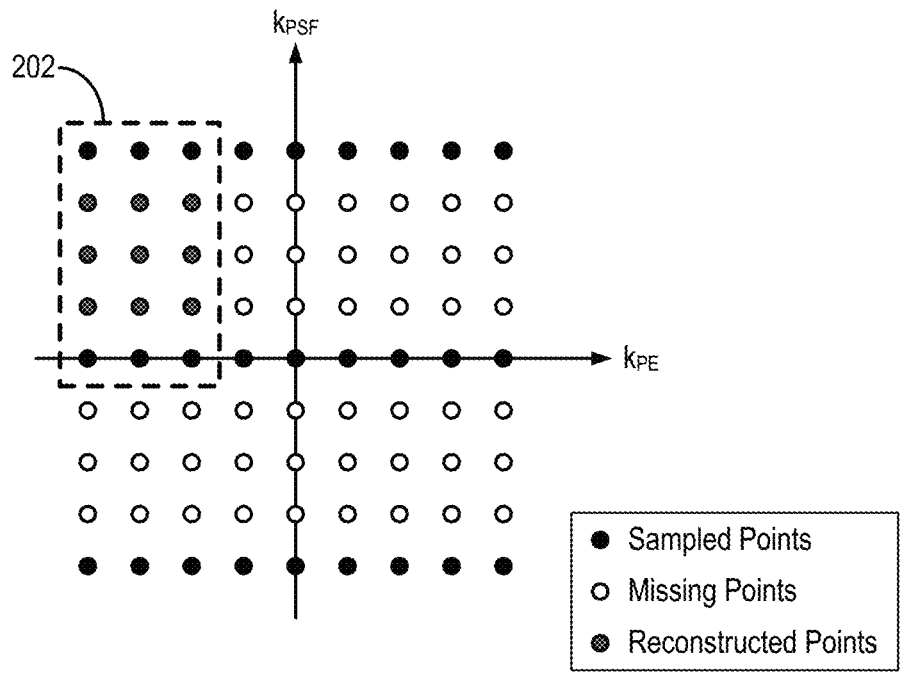
FIG. 2A is an example of a phase encoded and PSF encoded subspace of k-space, in which a rectangular reconstruction kernel is used to synthesize unsampled k-space points.

FIG. 2A shows an example of a $k_{PE}$-$k_{PSF}$ sampling used in conventional PSF-EPI. In these methods, a square kernel 202 is used to reconstruct the missing signals along the PSF-encoding dimension after undersampling of the phase-encoding data, $k_{PE}$, has been recovered using PE-GRAPPA.

Figure 2B:
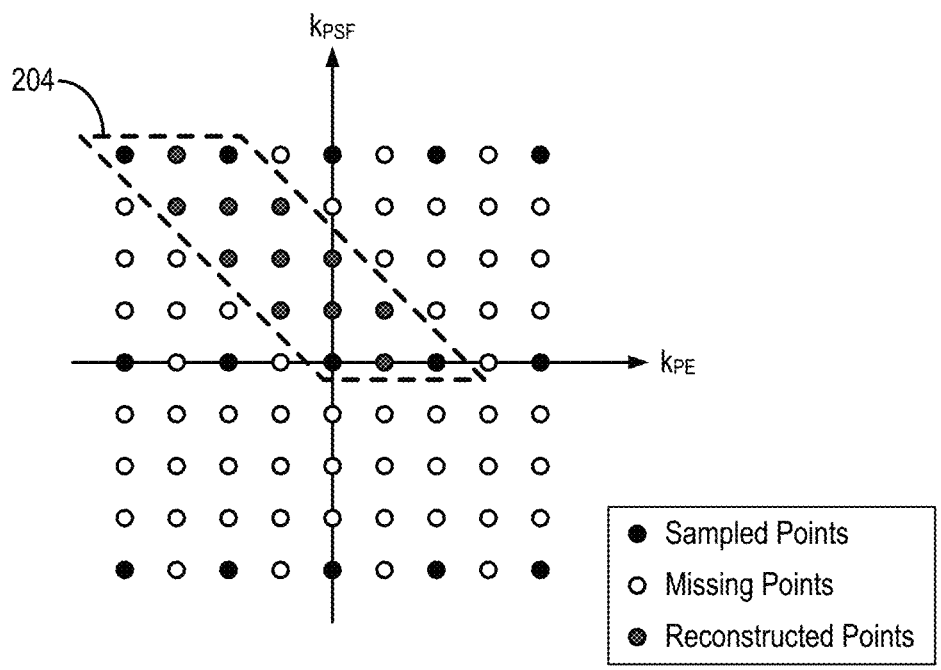
FIG. 2B is an example of a phase encoded and PSF encoded subspace of k-space, in which a tilted reconstruction kernel is used to synthesize unsampled k-space points.

FIG. 2B shows an example of a $k_{PE}$-$k_{PSF}$ sampling used in some embodiments of the systems and methods described in the present disclosure. As shown, additional acceleration can be provide along the $k_{PE}$ dimension. A tilted kernel 204 is then used to take advantage of the strong correlation of the PE-PSF dimension through a joint PE-PSF reconstruction, rather than a sequential reconstruction as is done in conventional PSF-EPI techniques.

In general, the tilted kernel 204 is oriented at −45 degrees in the $k_{PE}$-$k_{PSF}$ plane; however, in other implementations the tilted kernel could also be oriented at +45 degrees in the $k_{PE}$-$k_{PSF}$ plane, or at other angles. The tilted kernel 204 spans one or more points in the $k_{PE}$ dimension and one or more points in the $k_{PSF}$ dimension. In the example shown in FIG. 2B, the tilted kernel 204 spans three points in the $k_{PE}$ dimension and five points in the $k_{PSF}$ dimension.

As shown, additional acceleration can be provided along the $k_{PE}$ dimension. A tilted kernel 204 is then used to take advantage of the strong correlation of the PE-PSF dimension through a joint PE-PSF reconstruction, rather than a sequential reconstruction as is done in conventional PSF-EPI techniques.

Figure 2C:
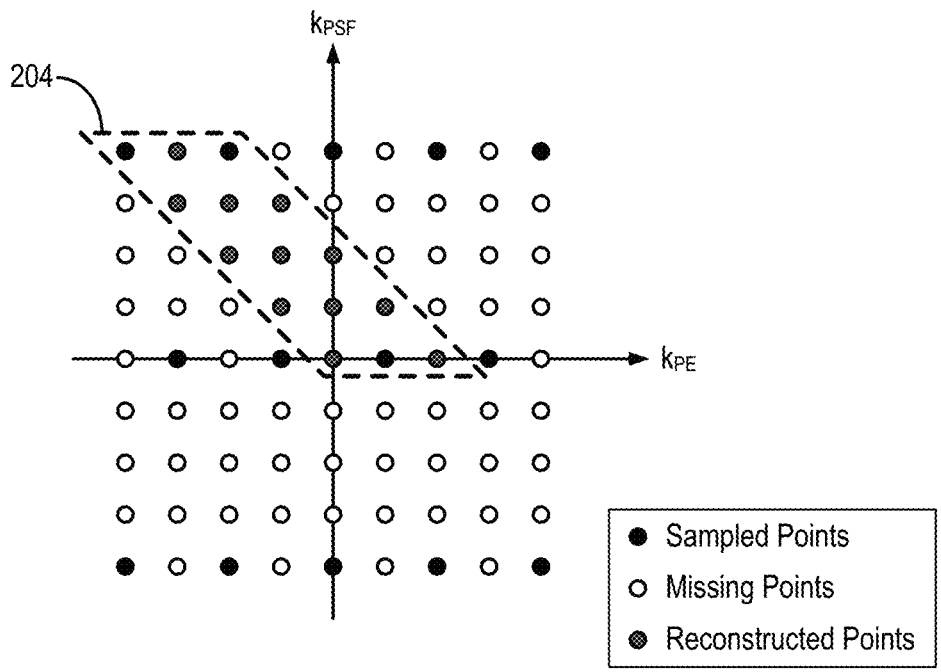
FIG. 2C is an example of a phase encoded and PSF encoded subspace of k-space, in which a tilted reconstruction kernel is used to synthesize unsampled k-space points and in which alternating phase encoding lines are shifted relative to each other.

FIG. 2C shows an example of a $k_{PE}$-$k_{PSF}$ sampling used in some other embodiments of the systems and methods described in the present disclosure. In this example, the sampling along the $k_{PE}$ dimension is shifted to achieve an optimized sampling pattern for parallel imaging. For instance, a 2D-CAIPIRINHA shift can be used.

To further reduce acquisition time, the tilted-CAIPI techniques described in the present disclosure can be combined with simultaneous multislice ("SMS") imaging techniques, such as blipped-CAIPI; partial Fourier acquisition, where partial Fourier along PSF and PE are recovered using a reconstruction such as a 3D POCS reconstruction; or both.

Figure 2D:
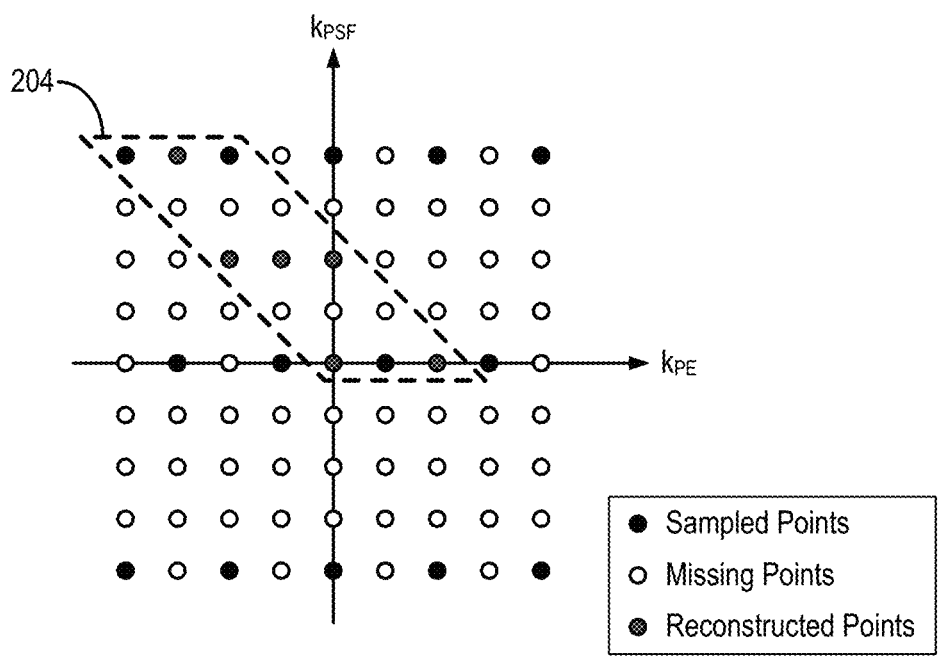
FIG. 2D is an example of phase encoded and PSF encoded calibration data.

For kernel training, low-resolution fully-sampled PSF-EPI data can be acquired with matching effective ESP. This calibration scan time can be reduced using SMS techniques; reduced field-of-view ("FOV") reconstruction, which reduces the number of kernels to be trained; or both. As noted, and as shown in FIG. 2D, the calibration scan can be accelerated by only reconstructing a part of k-space using GRAPPA, or another suitable reconstruction method, on the PSF encodings (i.e., PSF-GRAPPA). In these instances, the remaining aliasing in y-PSF can be unfolded in the image domain. As one example, this unfolding can be achieved using a reduced field-of-view ("FOV") technique, such as by applying an rFOV technique to the PSF encoding. $rFOV_{PSF}$.

Figure 3:
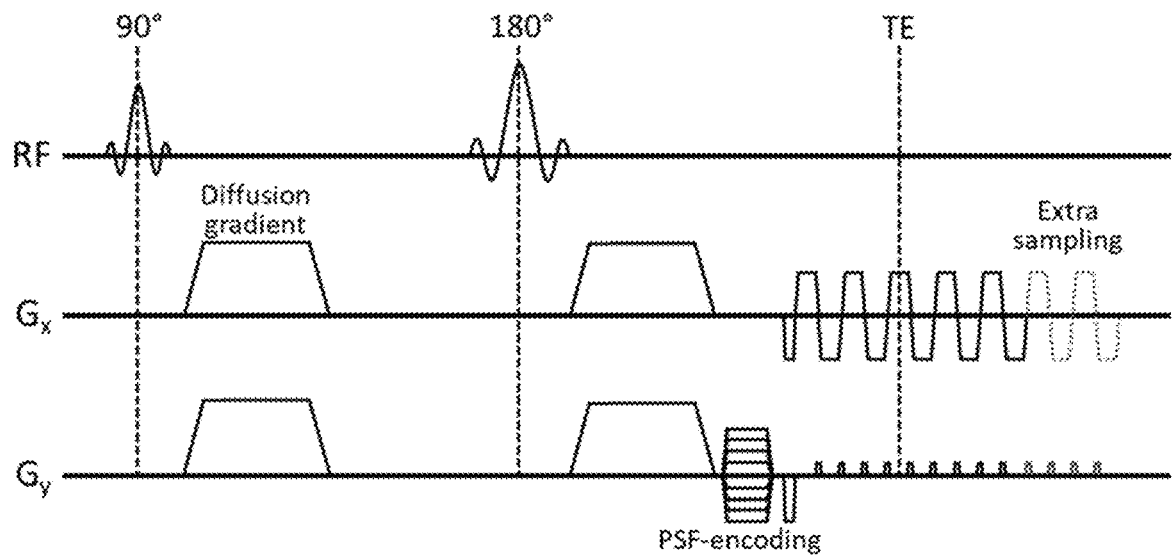
FIG. 3 illustrates an extended readout for acquiring additional low-frequency data for some or all PSF encodings in a diffusion-weighted PSF-EPI pulse sequence.

A big challenge for multi-shot DWI is the correction of shot-to-shot image phase corruption due to physiological motion during diffusion encoding. Here, a self-navigated method is provided for PSF-EPI. As shown in FIG. 3, at the end of the readout, several extra phase encoding lines are acquired. These extra phase encoding lines help to ensure that low-frequency k-space data are acquired in every PSF shot. These low-frequency k-space data enable the self-navigated phase estimation described below.

Figure 4:
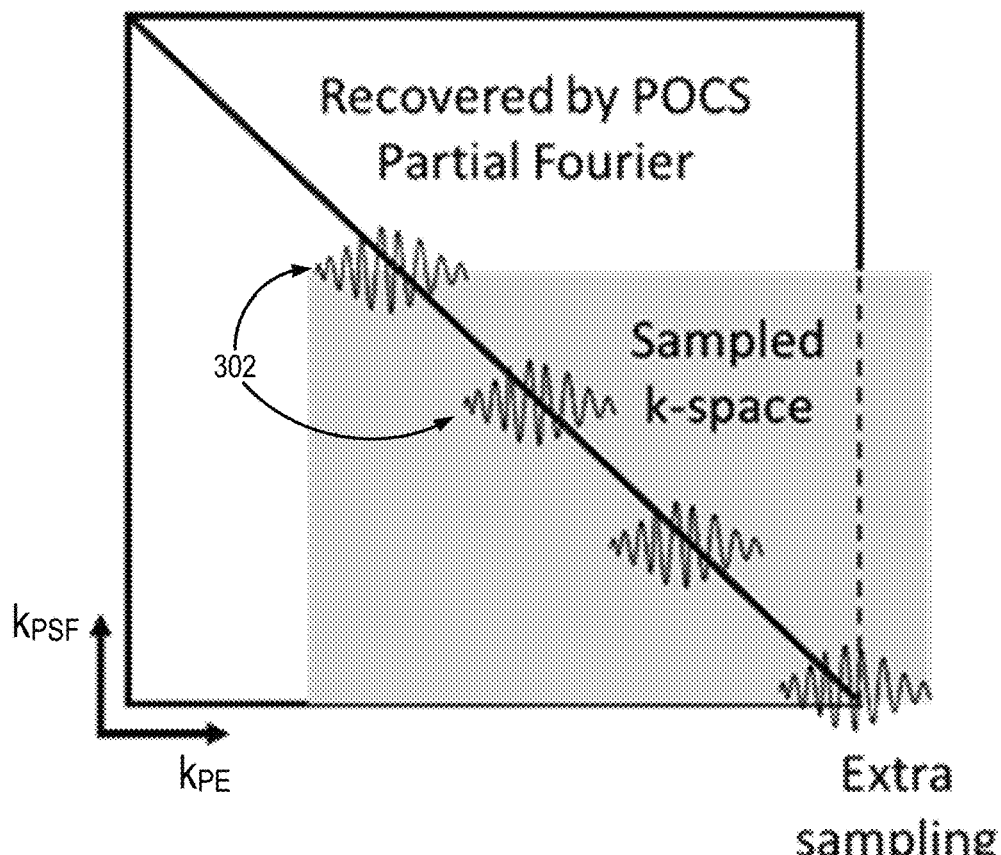
FIG. 4 is an illustration of self-navigation of PSF-EPI, in which several PSF-encoded shots are acquired with partial Fourier and where each contains a portion of low-frequency signals as a self-navigator.

As shown in FIG. 4, each $k_{PSF}$-encoding step contains a portion of two-dimensional low-frequency signals 402 in $k_x$-$k_y$ ($k_x$ is omitted), which can be used to estimate the image phase of that shot. Because identical $k_{PSF}$-encodings are used for non-diffusion-weighted and diffusion-weighted images, physiological motion-induced phase can be estimated by subtracting the phase of a non-diffusion-weighted image from the phase of a diffusion-weighted image of the same $k_{PSF}$-encoding. However, the $k_{PSF}$-encoding shifts the k-space center, which causes the last several $k_{PSF}$-encoding steps to lose low-frequency information. To compensate for the missing low-frequency signals, extra-sampling of PE lines is implemented, as shown in FIG. 3.

A joint PSF-PE GRAPPA reconstruction across $k_{PSF}$-$k_{PE}$ data is used to achieve high-quality reconstruction. Shot-to-shot phase variation across $k_{PSF}$ is accounted for prior to this reconstruction. Here, the phase corruption of each $k_{PSF}$ shot is estimated by first reconstructing each shot individually through conventional methods (e.g. conventional slice-GRAPPA and inplane-GRAPPA), and then comparing the reconstructed image phase to that of the non-diffusion-weighted data at the same $k_{PSF}$-encoding. The estimated phase is then added into calibration data for each PSF-encoding as additional information to train a PSF-GRAPPA kernel for each DWI volume.

Figure 5:
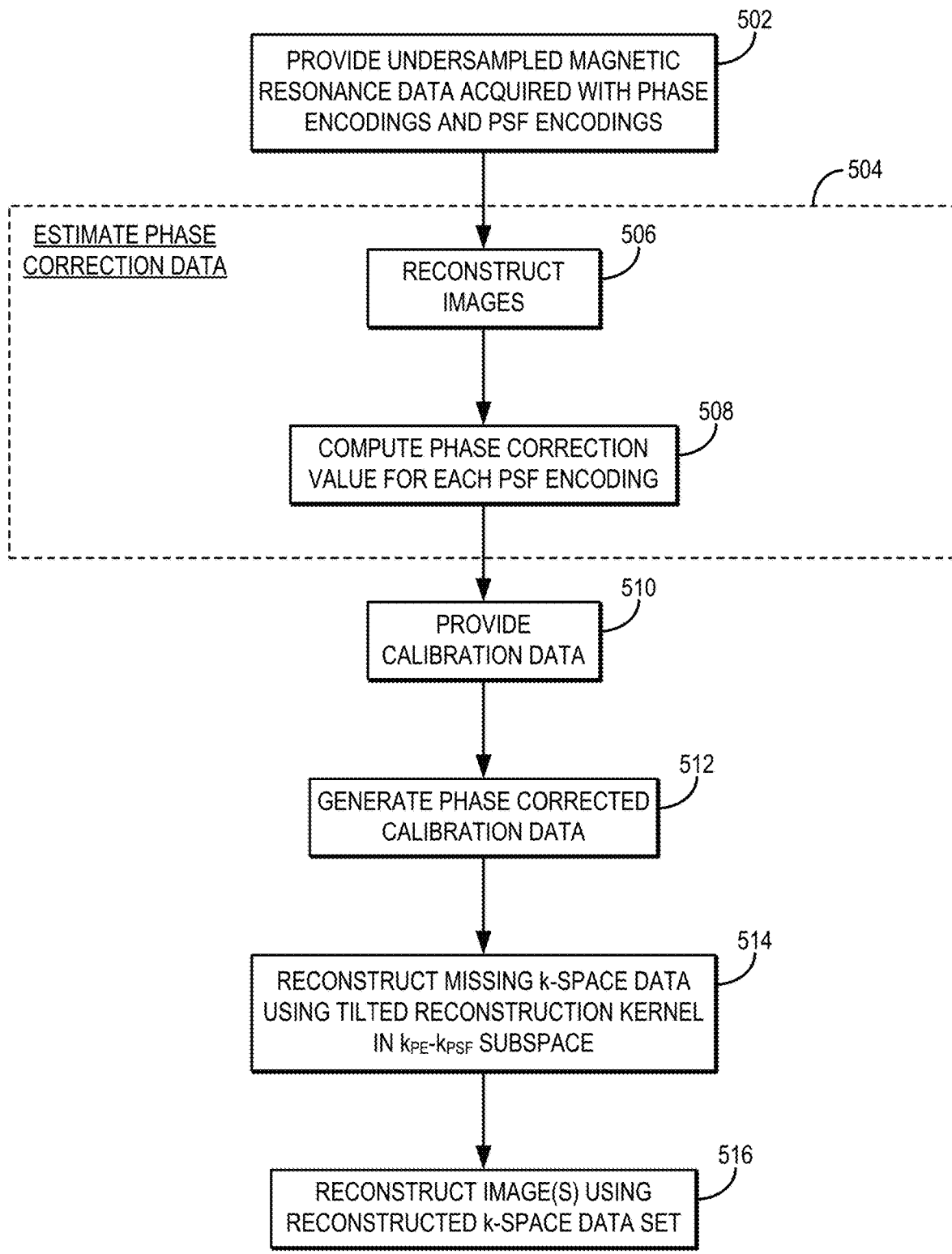
FIG. 5 is a flowchart setting forth the steps of an example method for generating an image using a self-navigated, phase corrected tilted-CAIPI process in accordance with some embodiments described in the present disclosure.

Referring now to FIG. 5, a flowchart is illustrated as setting forth the steps of an example method for reconstructing an image of a subject using a tilted-CAIPI technique with self-navigated phase correction, such as those described above. The method includes providing magnetic resonance data to a computer system, as indicated at step 502. The magnetic resonance data may be provided to the computer system by retrieving previously acquired data from a memory or other data storage. The magnetic resonance data may also be provided to the computer system by acquiring such data with an MRI system that then communicates the magnetic resonance data to the computer system. In some instances, the computer system may form a part of the MRI system.

In any instance, the magnetic resonance data are undersampled data that are acquired using a pulse sequence that provides both phase encoding and PSF encoding. In general, this encoding can be provided by acquiring multiple phase encodings in each of a plurality of different PSF encodings through the application of gradients along the same direction. In the examples described above, phase encoding and PSF encoding are provided through the application of gradients along the y-direction; however, it will be appreciated that phase encoding and PSF encoding can also be provided along other directions (e.g., the x-direction or the z-direction) based on slice orientation or user preference.

As an example, the magnetic resonance data can be acquired using a PSF-EPI pulse sequence that samples k-space along a plurality of phase encoding steps while looping over a plurality of different PSF encoding steps. As a result, data are acquired as 3D data (e.g., ($k_x$, $k_y$, $k_{PSF}$) data) for each slice. As mentioned above, the phase encoding lines can be shifted using techniques such as 2D-CAIPIR-INHA.

As noted above, the magnetic resonance data are data acquired using a diffusion-weighted pulse sequence. In this manner, the data include both non-diffusion-weighted data (e.g., data acquired with a b-value of zero) and diffusion-weighted data. As also noted above, the magnetic resonance data may also include additional data acquired by sampling low-frequency data in the terminal portion of the readout for some or all of the PSF encodings.

As generally indicated at process block 504, phase correction data are estimated for each PSF encoding. These phase estimates can be computed by reconstructing images from the magnetic resonance data using conventional parallel imaging techniques, as indicated at step 506. For instance, images can be reconstructed using inplane-GRAPPA or, where simultaneous multislice acquisitions are implemented, slice-GRAPPA followed by inplane-GRAPPA. A phase estimate is then computed for each PSF encoding by computing a difference in the phase between the non-diffusion-weighted image and the diffusion-weighted image reconstructed for the same PSF encoding, as indicated at step 508.

Calibration data are provided to the computer system to aid in the reconstruction of missing k-space data, as indicated at step 510. Calibration data can be acquired in a separate calibration scan. For instance, the calibration data can be acquired using a non-diffusion-weighted scan. The calibration data can also be acquired using an accelerated acquisition, in which case additional calibration data can be synthesized using a tilted reconstruction kernel as described in the present disclosure. A single calibration dataset can be used to reconstruct multiple data sets. By acquiring low-resolution calibration scan data at shorter echo times, whole-brain calibration scan times can be reduced to less than 20 s.

The phase correction data are then combined with the calibration data to generate phase corrected calibration data, as indicated at step 512. The magnetic resonance data are then processed to jointly reconstruct missing k-space data in the phase encodings and PSF encodings (i.e., in the $k_{PE}$-$k_{PSF}$ subspace), as indicated at step 514. As noted above, this reconstruction implements a tilted kernel that exploits the correlation between data acquired in the $k_{PE}$-$k_{PSF}$ subspace. The missing k-space data can be reconstructed using a GRAPPA, or other suitable, algorithm that has been adapted to jointly reconstruct k-space data points in both the $k_{PE}$ and $k_{PSF}$ dimensions.

One or more images are then reconstructed from the resulting k-space data, as indicated at step 516, using a suitable image reconstruction algorithm. In some instances, a low-rank based image reconstruction algorithm can be implemented to further improve acceleration performance, reconstruction performance, or both. As noted above, the resulting images will have reduced or otherwise removed $B_0$ distortions and $T_2^*$ blurring.

The tilted-CAIPI methods described in the present disclosure achieve dramatic acceleration for PSF-EPI by exploiting the inherent correlation in $k_{PE}$-$k_{PSF}$ with optimized under-sampling and $B_0$-inhomogeneity-informed reconstruction.

The tilted-CAIPI methods described in the present disclosure improve the acquisition efficiency of current commercial MRI pulse sequences. Tilted-CAIPI enables fast whole-brain MR imaging without distortion and blurring, including $T_2$-weighted, $T_2^*$-weighted, and diffusion-weighted imaging for numerous clinical applications. In particular, this technology has the potential to shorten MRI brain exams by a factor of ten (e.g., from 20-30 minutes to just 1-2 minutes). The systems and methods described in the present disclosure therefore provide an improvement to the function of the MRI system, and can enable significant improvement in the image quality and acquisition efficiency for diffusion imaging without distortion and blurring. These techniques can improve the reliability of diffusion imaging for multiple clinical applications with precise structural details.

Figure 6:
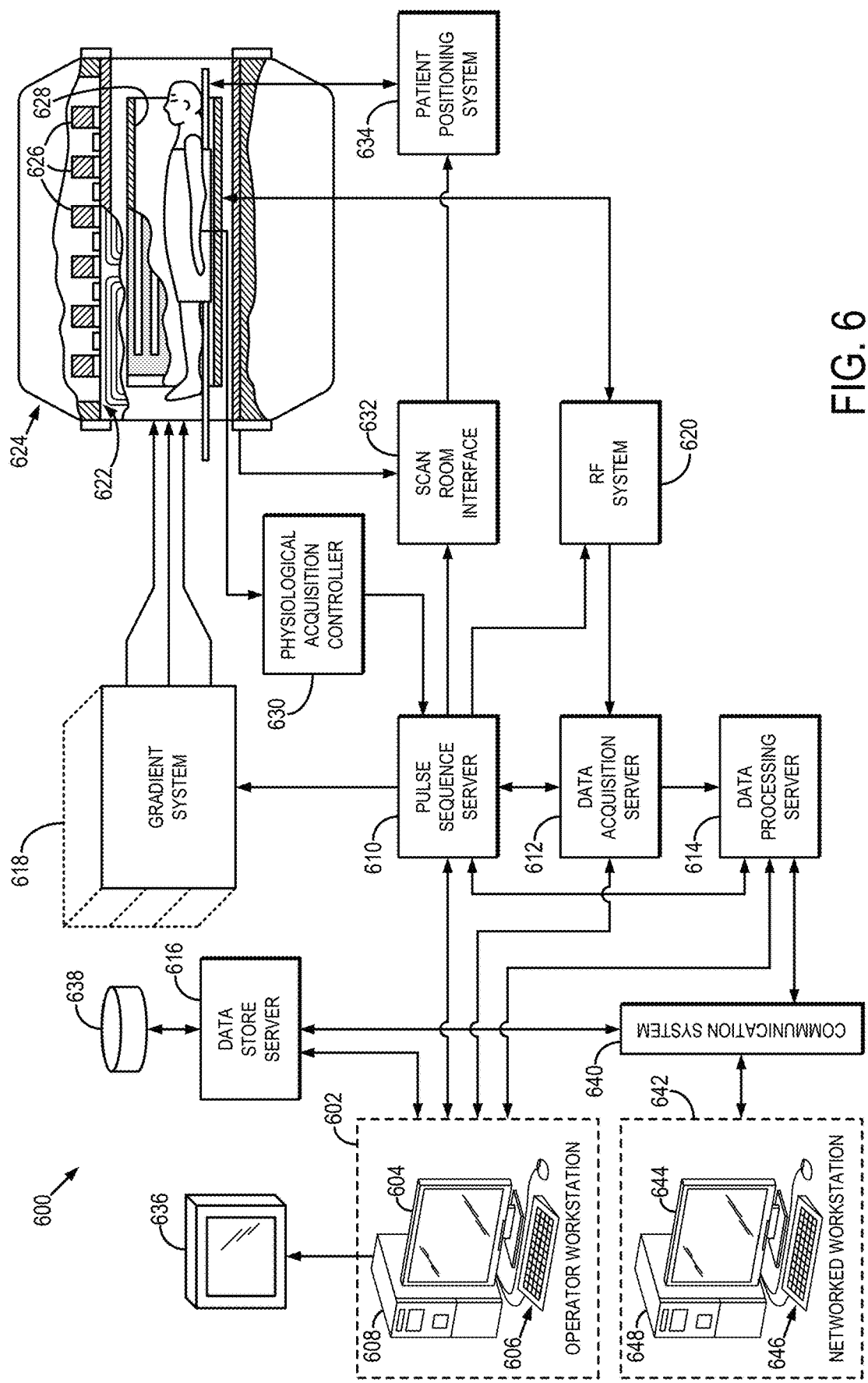
FIG. 6 is a block diagram of an example magnetic resonance imaging ("MRI") system that can implement some embodiments described in the present disclosure.

Referring particularly now to FIG. 6, an example of an MRI system 600 that can implement the methods described here is illustrated. The MRI system 600 includes an operator workstation 602 that may include a display 604, one or more input devices 606 (e.g., a keyboard, a mouse), and a processor 608. The processor 608 may include a commercially available programmable machine running a commercially available operating system. The operator workstation 602 provides an operator interface that facilitates entering scan parameters into the MRI system 600. The operator workstation 602 may be coupled to different servers, including, for example, a pulse sequence server 610, a data acquisition server 612, a data processing server 614, and a data store server 616. The operator workstation 602 and the servers 610, 612, 614, and 616 may be connected via a communication system 640, which may include wired or wireless network connections.

The pulse sequence server 610 functions in response to instructions provided by the operator workstation 602 to operate a gradient system 618 and a radiofrequency ("RF") system 620. Gradient waveforms for performing a prescribed scan are produced and applied to the gradient system 618, which then excites gradient coils in an assembly 622 to produce the magnetic field gradients $G_x$, $G_y$, and $G_z$ that are used for spatially encoding magnetic resonance signals. The gradient coil assembly 622 forms part of a magnet assembly 624 that includes a polarizing magnet 626 and a whole-body RF coil 628.

RF waveforms are applied by the RF system 620 to the RF coil 628, or a separate local coil to perform the prescribed magnetic resonance pulse sequence. Responsive magnetic resonance signals detected by the RF coil 628, or a separate local coil, are received by the RF system 620. The responsive magnetic resonance signals may be amplified, demodulated, filtered, and digitized under direction of commands produced by the pulse sequence server 610. The RF system 620 includes an RF transmitter for producing a wide variety of RF pulses used in MRI pulse sequences. The RF transmitter is responsive to the prescribed scan and direction from the pulse sequence server 610 to produce RF pulses of the desired frequency, phase, and pulse amplitude waveform. The generated RF pulses may be applied to the whole-body RF coil 628 or to one or more local coils or coil arrays.

The RF system 620 also includes one or more RF receiver channels. An RF receiver channel includes an RF preamplifier that amplifies the magnetic resonance signal received by the coil 628 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M = \sqrt{I^2 + Q^2} \qquad (1);$$

and the phase of the received magnetic resonance signal may also be determined according to the following relationship:

$$\varphi = \tan^{-1}\left(\frac{Q}{I}\right). \qquad (2)$$

The pulse sequence server 610 may receive patient data from a physiological acquisition controller 630. By way of example, the physiological acquisition controller 630 may receive signals from a number of different sensors connected to the patient, including electrocardiograph ("ECG") signals from electrodes, or respiratory signals from a respiratory bellows or other respiratory monitoring devices. These signals may be used by the pulse sequence server 610 to synchronize, or "gate," the performance of the scan with the subject's heart beat or respiration.

The pulse sequence server 610 may also connect to a scan room interface circuit 632 that receives signals from various sensors associated with the condition of the patient and the magnet system. Through the scan room interface circuit 632, a patient positioning system 634 can receive commands to move the patient to desired positions during the scan.

The digitized magnetic resonance signal samples produced by the RF system 620 are received by the data acquisition server 612. The data acquisition server 612 operates in response to instructions downloaded from the operator workstation 602 to receive the real-time magnetic resonance data and provide buffer storage, so that data is not lost by data overrun. In some scans, the data acquisition server 612 passes the acquired magnetic resonance data to the data processor server 614. In scans that require information derived from acquired magnetic resonance data to control the further performance of the scan, the data acquisition server 612 may be programmed to produce such information and convey it to the pulse sequence server 610. For example, during pre-scans, magnetic resonance data may be acquired and used to calibrate the pulse sequence performed by the pulse sequence server 610. As another example, navigator signals may be acquired and used to adjust the operating parameters of the RF system 620 or the gradient system 618, or to control the view order in which k-space is sampled. In still another example, the data acquisition server 612 may also process magnetic resonance signals used to detect the arrival of a contrast agent in a magnetic resonance angiography ("MRA") scan. For example, the data acquisition server 612 may acquire magnetic resonance data and processes it in real-time to produce information that is used to control the scan.

The data processing server 614 receives magnetic resonance data from the data acquisition server 612 and processes the magnetic resonance data in accordance with instructions provided by the operator workstation 602. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 614 are conveyed back to the operator workstation 602 for storage. Real-time images may be stored in a data base memory cache, from which they may be output to operator display 602 or a display 636. Batch mode images or selected real time images may be stored in a host database on disc storage 638. When such images have been reconstructed and transferred to storage, the data processing server 614 may notify the data store server 616 on the operator workstation 602. The operator workstation 602 may be used by an operator to archive the images, produce films, or send the images via a network to other facilities.

The MRI system 600 may also include one or more networked workstations 642. For example, a networked workstation 642 may include a display 644, one or more input devices 646 (e.g., a keyboard, a mouse), and a processor 648. The networked workstation 642 may be located within the same facility as the operator workstation 602, or in a different facility, such as a different healthcare institution or clinic.

The networked workstation 642 may gain remote access to the data processing server 614 or data store server 616 via the communication system 640. Accordingly, multiple networked workstations 642 may have access to the data processing server 614 and the data store server 616. In this manner, magnetic resonance data, reconstructed images, or other data may be exchanged between the data processing server 614 or the data store server 616 and the networked workstations 642, such that the data or images may be remotely processed by a networked workstation 642.

Figure 7:
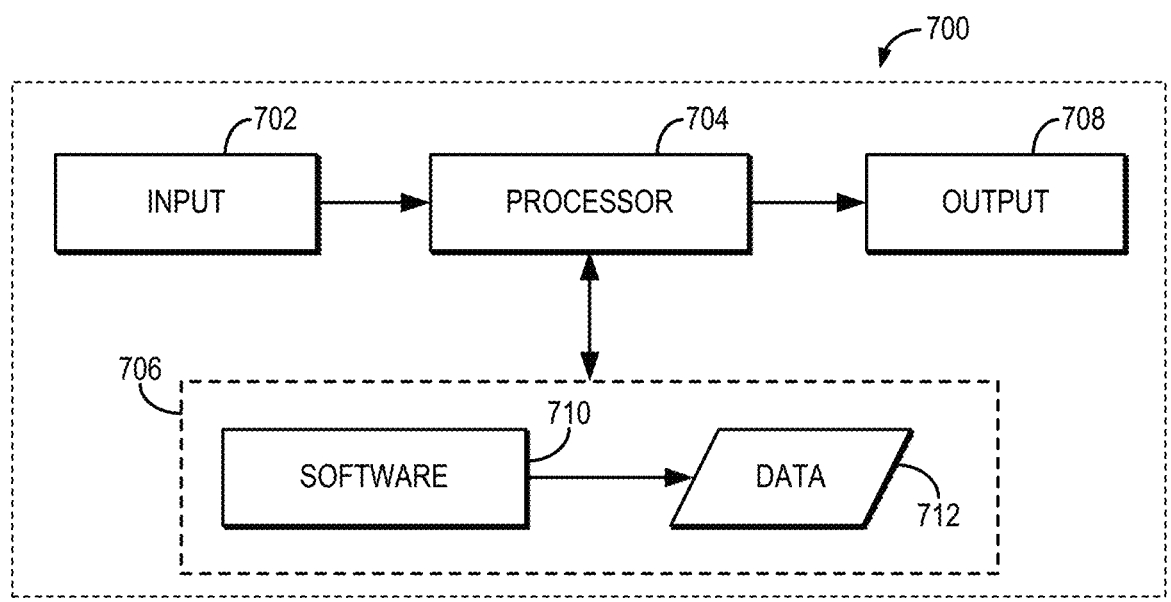
FIG. 7 is a block diagram of an example computer system that can implement some embodiments described in the present disclosure.

Referring now to FIG. 7, a block diagram of an example of a computer system 700 that can perform the methods described in the present disclosure is shown. The computer system 700 generally includes an input 702, at least one hardware processor 704, a memory 706, and an output 708. Thus, the computer system 700 is generally implemented with a hardware processor 704 and a memory 706.

In some embodiments, the computer system 700 can be a workstation, a notebook computer, a tablet device, a mobile device, a multimedia device, a network server, a mainframe, one or more controllers, one or more microcontrollers, or any other general-purpose or application-specific computing device.

The computer system 700 may operate autonomously or semi-autonomously, or may read executable software instructions from the memory 706 or a computer-readable medium (e.g., a hard drive, a CD-ROM, flash memory), or may receive instructions via the input 702 from a user, or any another source logically connected to a computer or device, such as another networked computer or server. Thus, in some embodiments, the computer system 700 can also include any suitable device for reading computer-readable storage media.

In general, the computer system 700 is programmed or otherwise configured to implement the methods and algorithms described in the present disclosure. For instance, the computer system 700 can be programmed to compute reconstruction kernels, synthesize additional k-space data, and reconstruct images as described.

The input 702 may take any suitable shape or form, as desired, for operation of the computer system 700, including the ability for selecting, entering, or otherwise specifying parameters consistent with performing tasks, processing data, or operating the computer system 700. In some aspects, the input 702 may be configured to receive data, such as data acquired with an MRI system. Such data may be processed as described above to synthesize additional k-space data and reconstruct images. In addition, the input 702 may also be configured to receive any other data or information considered useful for reconstructing images using the methods described above.

Among the processing tasks for operating the computer system 700, the one or more hardware processors 704 may also be configured to carry out any number of post-processing steps on data received by way of the input 702.

The memory 706 may contain software 710 and data 712, such as data acquired with an MRI system, and may be configured for storage and retrieval of processed information, instructions, and data to be processed by the one or more hardware processors 704. In some aspects, the software 710 may contain instructions directed to estimating reconstruction kernels, synthesizing additional k-space data, and reconstructing images as described.

In addition, the output 708 may take any shape or form, as desired, and may be configured for displaying reconstructed images, in addition to other desired information.

The present disclosure has described one or more preferred embodiments, and it should be appreciated that many equivalents, alternatives, variations, and modifications, aside from those expressly stated, are possible and within the scope of the invention.

The invention claimed is:

1. A method for reconstructing an image of a subject from data acquired with a magnetic resonance imaging (MRI) system, the steps of the method comprising:
    (a) acquiring first data with a magnetic resonance imaging (MRI) system, wherein:
        the first data comprise k-space data encoded along at least a phase encoding dimension and a point spread function (PSF) encoding dimension;
        the first data are undersampled along at least one of the phase encoding dimension or the PSF encoding dimension; and
        the first data comprise non-diffusion-weighted data and diffusion-weighted data;
    (b) generating phase correction data from the first data by estimating a phase correction value for each PSF encoding in the first data, wherein each phase correction value is computed by:
        reconstructing a diffusion weighted image from the diffusion weighted data acquired at a particular PSF encoding;
        reconstructing a non-diffusion-weighted image from the non-diffusion-weighted image acquired at the particular PSF encoding; and
        computing a difference between a phase of the diffusion-weighted image and a phase of the non-diffusion-weighted image;
    (c) providing calibration data to a computer system;
    (d) generating phase corrected calibration data by combining the phase correction data with the calibration data;
    (e) generating second data with the computer system by synthesizing unsampled k-space points in at least one of the phase encoding dimension or the PSF encoding dimension by using the phase corrected calibration data and applying a tilted reconstruction kernel to the first data, wherein the tilted reconstruction kernel spans the phase encoding dimension and the PSF encoding dimension; and
    (f) reconstructing an image from the second data.

2. The method as recited in claim 1, wherein the tilted reconstruction kernel is tilted at an angle relative to at least one of the phase encoding dimension and the PSF encoding dimension.

3. The method as recited in claim 2, wherein the tilted reconstruction kernel is tilted at a 45 degree angle relative to the PSF encoding dimension.

4. The method as recited in claim 1, wherein step (b) jointly synthesizes unsampled k-space points in both the phase encoding dimension and the PSF encoding dimension.

5. The method as recited in claim 1, wherein the tilted reconstruction kernel is structured to exploit correlations between the phase encoding dimension and the PSF encoding dimension.

6. The method as recited in claim 1, wherein the first data are acquired using a PSF echo planar imaging (EPI) pulse sequence that acquires multiple phase encodings for each of a plurality of different PSF encodings.

7. The method as recited in claim 6, wherein the PSF EPI pulse sequence includes a PSF-encoding loop that samples a point on the PSF encoding dimension at a plurality of different points on the phase encoding dimension.

8. The method as recited in claim 7, wherein acquiring the first data comprises acquiring additional phase encoding lines at the end of each readout, such that low-frequency k-space data are acquired in each PSF encoding shot.

9. The method as recited in claim 1, further comprising providing calibration data to the computer system and using the calibration data when synthesizing the unsampled k-space points.

10. The method as recited in claim 9, wherein the first data are acquired using a first pulse sequence having a first echo spacing, and the calibration data are acquired using a second pulse sequence having a second echo spacing that is the same as the first echo spacing.

11. The method as recited in claim 10, wherein the first pulse sequence and the second pulse sequence are both a PSF echo planar imaging (EPI) pulse sequence, and wherein the calibration data are acquired with a lower resolution than the first data.

12. The method as recited in claim 1, wherein the first data comprise k-space data in which alternating phase encoding lines are shifted relative to each other.

13. The method as recited in claim 12, wherein alternating phase encoding lines are shifted along the phase encoding dimension relative to each other.

14. The method as recited in claim 1, wherein encoding the k-space data along the phase encoding dimension and the PSF encoding dimension both implement magnetic field gradients applied along a same spatial direction.

15. The method as recited in claim 1, wherein synthesizing the unsampled k-space points includes using a GRAPPA algorithm that implements the tilted reconstruction kernel.

16. The method as recited in claim 1, wherein acquiring the first data comprises acquiring additional phase encoding lines at the end of each readout, such that low-frequency k-space data are acquired in each PSF encoding shot.

* * * * *